United States Patent
Takeoka

(10) Patent No.: US 8,247,873 B2
(45) Date of Patent: Aug. 21, 2012

(54) SEMICONDUCTOR DEVICE AND METHOD FOR MANUFACTURING THE SAME

(75) Inventor: Shinji Takeoka, Leuven (BE)

(73) Assignee: Panasonic Corporation, Osaka (JP)

( * ) Notice: Subject to any disclaimer, the term of this patent is extended or adjusted under 35 U.S.C. 154(b) by 157 days.

(21) Appl. No.: 12/621,965

(22) Filed: Nov. 19, 2009

(65) Prior Publication Data

US 2010/0065910 A1    Mar. 18, 2010

Related U.S. Application Data

(63) Continuation of application No. PCT/JP2009/000154, filed on Jan. 16, 2009.

(30) Foreign Application Priority Data

Apr. 17, 2008   (JP) .................... 2008-107427

(51) Int. Cl.
*H01L 29/76* (2006.01)

(52) U.S. Cl. ........ 257/371; 257/344; 257/374; 257/392; 257/E27.06; 257/E27.062

(58) Field of Classification Search .................. 257/344, 257/371, 374, 392, E27.06, E27.062
See application file for complete search history.

(56) References Cited

U.S. PATENT DOCUMENTS

| | | | |
|---|---|---|---|
| 2001/0003679 A1* | 6/2001 | Cathey et al. | 438/740 |
| 2004/0188769 A1 | 9/2004 | Tsuno | |
| 2005/0190421 A1 | 9/2005 | Chen et al. | |
| 2007/0278589 A1 | 12/2007 | Tamura et al. | |
| 2008/0020591 A1 | 1/2008 | Balseanu et al. | |
| 2008/0073676 A1 | 3/2008 | Takeoka | |
| 2008/0122011 A1* | 5/2008 | Wu | 257/392 |
| 2008/0124856 A1 | 5/2008 | Pidin et al. | |
| 2008/0128825 A1* | 6/2008 | Sato et al. | 257/369 |

FOREIGN PATENT DOCUMENTS

| | | |
|---|---|---|
| JP | 2004-335497 | 11/2004 |
| JP | 2004-349372 | 12/2004 |
| JP | 2007-200961 | 8/2007 |
| JP | 2007-208079 | 8/2007 |
| JP | 2008-016569 | 1/2008 |

* cited by examiner

*Primary Examiner* — Minchul Wang
(74) *Attorney, Agent, or Firm* — McDermott Will & Emery LLP

(57) ABSTRACT

A semiconductor device includes a first MISFET and a second MISFET, wherein the first MISFET includes a semiconductor substrate 100, a first gate insulating film 101a and a first gate electrode 102a formed on the first region of the semiconductor substrate, and first side walls (103a, 120a) formed on the side surface of the first gate electrode 102a, and the second MISFET includes a second gate insulating film 101b and a second gate electrode 102b formed on the second region of the semiconductor substrate 100, and second side walls (103b, 120b) formed on the side surface of the second gate electrode 102b. The width of the first side wall is smaller than the width of the second side wall, and the second side wall includes the second spacer 103b containing a higher concentration of hydrogen than the first spacer 103a.

12 Claims, 8 Drawing Sheets

(a)

(b)

(c)

SEMICONDUCTOR DEVICE AND METHOD FOR MANUFACTURING THE SAME

CROSS-REFERENCE TO RELATED APPLICATION

This is a continuation of PCT International Application PCT/JP2009/000154 filed on Jan. 16, 2009, which claims priority to Japanese Patent Application No. 2008-107427 filed on Apr. 17, 2008. The disclosures of these applications including the specifications, the drawings, and the claims are hereby incorporated by reference in its entirety.

TECHNICAL FIELD

The present disclosure relates to a semiconductor device including a p-type field effect transistor and an n-type field effect transistor, each having an inner side wall for adjusting the amount of offset and an outer side wall for forming source/drain regions, and a method for manufacturing the same.

BACKGROUND

With the shrinking of the semiconductor device design rules, the degree of circuit integration has improved dramatically, making it possible to include more than one hundred million field effect transistors (MISFETs) on a single chip. In order to realize such a chip, there is a demand not only for the development of microfabrication techniques such as lithography, etching, etc., with a process precision on the order of some tens of nanometers, but also for forming transistor structures separately suitable for n-channel MISFETs and p-channel MISFETs.

A conventional MISFET includes an inner side wall for adjusting the amount of offset (offset side wall) and an outer side wall for forming source and drain regions on the side surface of the gate electrode. With respect to an example where an offset side wall is formed, the formation method will be described briefly.

First, a gate electrode is formed on a semiconductor substrate, and then an insulating film such as a silicon oxide film is deposited across the entire wafer surface. Then, the entire wafer surface is etched back using a method such as dry etching to thereby form an offset side wall made of an insulator on a side surface of the gate electrode.

However, if an offset side wall is formed by a method described above, the width of the offset side wall will be the same between n-channel MISFETs and p-channel MISFETs. Typically, a source/drain extension implantation for an n-channel MISFET uses arsenic, which has a smaller thermal diffusion. On the other hand, a source/drain extension implantation for a p-channel MISFET uses boron, which thermally diffuses more easily. In the formation of a transistor, both the n-channel MISFET and the p-channel MISFET are simultaneously subjected to a heat treatment step such as an impurity activation annealing, and if the offset side wall is formed so as to suit the n-channel MISFET, for example, the width (thickness) will be small. With a small-width offset side wall used for the p-channel MISFET, boron diffuses across a wide area under the gate electrode, resulting in a large overlap between the gate electrode and the extension region, thus forming a transistor with its characteristics being significantly degraded due to the short-channel effect. On the other hand, if a thick offset side wall is formed so as to suit the p-channel MISFET, the n-channel MISFET will have a large ON resistance and the ON current will be degraded, due to the small amount of overlap between the gate electrode and the extension region.

For generations of relatively large gate lengths, the amount of overlap is relatively large, i.e., 10 nm or more, and the amount of overlap can be adjusted by adjusting the implantation dose of an impurity. However, for generations of very short gate lengths, e.g., 45 nm or 32 nm, it is required to adjust the amount of overlap on the order of nanometers, and it is therefore difficult to control the amount of overlap by merely adjusting the dose of the impurity to be implanted. Therefore, there is a demand for the formation of dual offset side walls in which the width can be optimized for each of the n-channel MISFET and the p-channel MISFET. Note that the "dual offset side walls" as used herein refer to side wall spacers that are used for adjusting the amount of offset of the diffusion layer in the extension region or the LDD region and that are provided separately for the p-channel MISFET and the n-channel MISFET.

A method for forming the dual offset side walls will be described with reference to FIGS. 8A to 8D (Patent Document 1). FIGS. 8A to 8D are diagrams showing a method for forming dual offset side walls according to a conventional example.

First, as shown in FIG. 8A, a first gate insulating film 1001a and a first gate electrode 1002a are formed on the n-channel MISFET formation region (left-hand portion of the figure) of a semiconductor substrate 1000, and a second gate insulating film 1001b and a second gate electrode 1002b are formed on the p-channel MISFET formation region (right-hand portion of the figure) of the semiconductor substrate 1000.

Then, as shown in FIG. 8B, an insulating film 1003, which is for forming an offset side wall made of a silicon oxide film, or the like, is deposited to a thickness of 10 nm across the entire surface of the semiconductor substrate 1000.

Then, as shown in FIG. 8C, with a resist mask 1004 over the p-channel MISFET formation region of the semiconductor substrate 1000, impurity ions 1005 of an impurity having a relatively large atomic weight such as arsenic are implanted across the entire surface of the semiconductor substrate 1000. In such a case, arsenic is implanted only into the insulating film 1003 on the n-channel MISFET formation region, and damages 1006 are introduced by the ion implantation into the insulating film 1003. The etching rate of a portion of the insulating film 1003 that has received the damages 1006 is higher than a portion that has not been damaged by the ion implantation. Therefore, the insulating film 1003 is thinned during an etch back 1007 and the subsequent washing step, resulting in a first offset side wall 1003a, which is thinner than a second offset side wall 1003b, formed on the side surface of the first gate electrode 1002a (see FIG. 8D).

Then, as shown in FIG. 8D, the insulating film 1003 is etched back after removing the resist mask 1004, thereby forming the first offset side wall 1003a and the second offset side wall 1003b thicker than the first offset side wall 1003a. Then, with the p-channel MISFET formation region covered by a resist, or the like, arsenic is ion-implanted into the n-channel MISFET formation region of the semiconductor substrate 1000 using the first gate electrode 1002a and the first offset side wall 1003a as a mask, thereby forming a first extension region 1010a. Then, with the n-channel MISFET formation region covered by a resist, or the like, boron is ion-implanted into the p-channel MISFET formation region of the semiconductor substrate 1000 using the second gate electrode 1002*b* and the second offset side wall 1003*b* as a mask, thereby forming a second extension region 1010*b*.

CITATION LIST

Patent Document

PATENT DOCUMENT 1: Japanese Patent Publication No. P2004-303789

SUMMARY

However, when dual offset side walls are formed by the method described above, the widths of the offset side walls may vary, resulting in unstable transistor characteristics. An important point in forming dual offset side walls by the above method is to ensure that the etching rate of the insulating film 1003 in the region where it is intended to form the first offset side wall 1003*a* is increased as compared with other regions, and for that point, an element of a large atomic weight such as arsenic is implanted into the insulating film 1003 to give the damages 1006. It is very difficult to keep constant the dry etching rate and the wet etching rate of the insulating film 1003, which has received the damages 1006. Although it is possible to form the first offset side wall 1003*a*, it is difficult to realize a constant width thereof without nonuniformity. Therefore, there will be transistors with significant characteristics variations.

It is an object of the present invention to provide a semiconductor device and a method for manufacturing the same, with which an impurity diffusion layer such as an extension region or a source/drain region can be formed with a good controllability.

In order to solve the problems in the prior art, the present inventor has found a method for selectively thinning the side wall width in an intended region, among all side walls provided on side surfaces of gate electrodes.

Specifically, a semiconductor device of the present invention includes: a semiconductor substrate in which a first region and a second region are formed; a first MISFET including a first gate insulating film formed on the first region of the semiconductor substrate, a first gate electrode formed on the first gate insulating film, and a first side wall made of an insulator formed on a side surface of the first gate electrode; and a second MISFET including a second gate insulating film formed on the second region of the semiconductor substrate, a second gate electrode formed on the second gate insulating film, and a second side wall made of an insulator formed on a side surface of the second gate electrode, wherein a width of the first side wall is smaller than a width of the second side wall, the first side wall has a first spacer, and the second side wall has a second spacer containing a higher concentration of hydrogen than the first spacer.

With this configuration, it is possible to selectively form an impurity diffusion layer in each of the first region and the second region in the presence of a first spacer and a second spacer having a larger width than the first spacer. Therefore, the impurity profile of the impurity diffusion layer, the position thereof, etc., can be optimized separately for each of the first MISFET and the second MISFET. For example, where the first MISFET is of an n-channel type and the second MISFET is of a p-channel type, it is possible, by employing such a configuration as described above, to prevent the degradation of the electrical characteristics of the first MISFET while suppressing the occurrence of the short-channel effect in the second MISFET even if there is a difference between the diffusiveness of the n-type impurity and that of the p-type impurity.

A method for manufacturing a semiconductor device of the present invention is a method for manufacturing a semiconductor device, including a semiconductor substrate in which a first region and a second region are formed, a first MISFET including a first gate electrode formed on the first region of the semiconductor substrate with a first gate insulating film interposed therebetween, and a second MISFET including a second gate electrode formed on the second region of the semiconductor substrate with a second gate insulating film interposed therebetween, the method including the steps of: (a) forming a hydrogen-containing insulating film on the semiconductor substrate in which the first gate electrode and the second gate electrode have been formed; (b) selectively irradiating the first region with ultraviolet rays so as to eliminate hydrogen from a portion of the insulating film that is formed in the first region; (c) after the step (b), etching back the insulating film so as to form a first spacer on a side surface of the first gate electrode and form a second spacer having a larger width than the first spacer on a side surface of the second gate electrode; (d) ion-implanting a first impurity selectively into the first region of the semiconductor substrate using the first spacer and the first gate electrode as a mask so as to form a first impurity layer in regions of the semiconductor substrate that are located on opposite sides of the first gate electrode; and (e) ion-implanting a second impurity selectively into the second region of the semiconductor substrate using the second spacer and the second gate electrode as a mask so as to form a second impurity layer in regions of the semiconductor substrate that are located on opposite sides of the second gate electrode.

With this method, since ultraviolet rays are used for shrinking the insulating film in the step (b), it is easy to selectively shrink the insulating film only in the first region. Since the shrinkage of the insulating film can be precisely controlled by adjusting the wavelength, the power, the irradiation time, etc., of the ultraviolet rays, it is possible to form a side wall having an intended width with a good controllability. In the steps (d) and (e), the first spacer and the second spacer having different widths are formed. Therefore, when the first impurity layer and the second impurity layer are formed respectively in the ion implantation using the first gate electrode and the first spacer as a mask and in the ion implantation using the second gate electrode and the second spacer as a mask, it is possible to optimize the impurity profile and the position of each impurity layer. Particularly, where the first MISFET is of an n-channel type and the second MISFET is of a p-channel type, the amount of gate overlap, etc., can be controlled taking into consideration the fact that a p-type impurity diffuses more easily than an n-type impurity.

It is preferred that a silicon nitride film formed by a plasma CVD method is used as the material of the insulating film because it is then possible to adjust the width over a wide range by eliminating hydrogen.

With the method for manufacturing a semiconductor device of the present invention, the impurity profile of the impurity diffusion layer can be optimized with a good controllability separately for each of the first MISFET and the second MISFET provided in different regions on the same substrate.

DETAILED DESCRIPTION

First Embodiment

Figure 1:
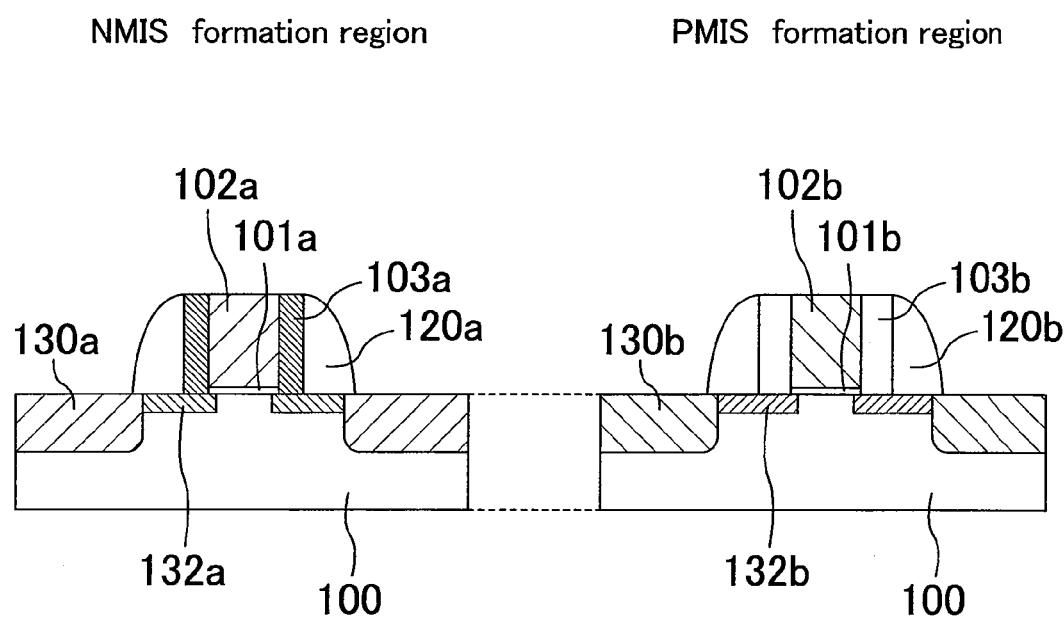
FIG. 1 is a cross-sectional view showing a semiconductor device according to a first embodiment of the present invention.

FIG. 1 is a cross-sectional view showing a semiconductor device according to a first embodiment of the present invention. Shown in the left-hand portion of the figure is an n-channel MISFET formation region where an n-channel MISFET is provided (hereinafter referred to as an "NMIS formation region"), and shown in the right-hand portion is a p-channel MISFET formation region where a p-channel MISFET is provided (hereinafter referred to as a "PMIS formation region").

As shown in FIG. 1, the semiconductor device of the present embodiment includes an n-channel MISFET formed in the NMIS formation region of a semiconductor substrate 100, and a p-channel MISFET formed in the PMIS formation region of the semiconductor substrate 100. Note that a p-type region (not shown) such as a p-type well is formed in the NMIS formation region of the semiconductor substrate 100, and an n-type region (not shown) such as an n-type well is formed in the PMIS formation region of the semiconductor substrate 100.

The n-channel MISFET includes a first gate insulating film 101a formed on the NMIS formation region of the semiconductor substrate 100, a first gate electrode 102a made of a conductor such as polysilicon and formed on the first gate insulating film 101a, a first inner side wall (first spacer) 103a made of a silicon nitride and formed on the side surface of the first gate electrode 102a, a first outer side wall 120a made of a silicon oxide, or the like, formed on the side surface of the first inner side wall 103a, a first extension region 132a containing an n-type impurity and formed in regions of the semiconductor substrate 100 that are located on opposite sides of the first gate electrode 102a under the first inner side wall 103a and the first outer side wall 120a, and a first source/drain region 130a containing a higher concentration of an n-type impurity than the first extension region 132a and formed in contact with the first extension region 132a in regions of the semiconductor substrate 100 that are located beside the first outer side wall 120a. The width of the first inner side wall 103a is 8 nm. The n-type impurity contained in the first extension region 132a and the first source/drain region 130a is arsenic or phosphorus, for example. The first outer side wall 120a is made of a silicon oxide, for example.

The p-channel MISFET includes a second gate insulating film 101b formed on the PMIS formation region of the semiconductor substrate 100, a second gate electrode 102b made of polysilicon, or the like, and formed on the second gate insulating film 101b, a second inner side wall (second spacer) 103b made of a silicon nitride formed on side surface of the second gate electrode 102b, a second outer side wall 120b made of a silicon oxide, or the like, formed on the side surface of the second inner side wall 103b, a second extension region 132b containing a p-type impurity and formed in regions of the semiconductor substrate 100 that are located on opposite sides of the second gate electrode 102b under the second inner side wall 103b and the second outer side wall, and a second source/drain region 130b containing a higher concentration of a p-type impurity than the second extension region 132b and formed in contact with the second extension region 132b in regions of the semiconductor substrate 100 that are located beside the second outer side wall 120b. The width of the second inner side wall 103b is about 10 nm, and is at least greater than the width of the first inner side wall 103a. The p-type impurity contained in the second source/drain region 130b and the second extension region 132b is boron, for example. Although the composition ratio between silicon and nitrogen is equal between the first inner side wall 103a and the second inner side wall 103b, the first inner side wall 103a has a greater film density. This is because the second inner side wall 103b contains more hydrogen than the first inner side wall 103a. Note that the first outer side wall 120a and the second outer side wall 120b have an equal thickness. The first gate insulating film 101a and the second gate insulating film 101b are formed by SiON, for example.

Figure 2:
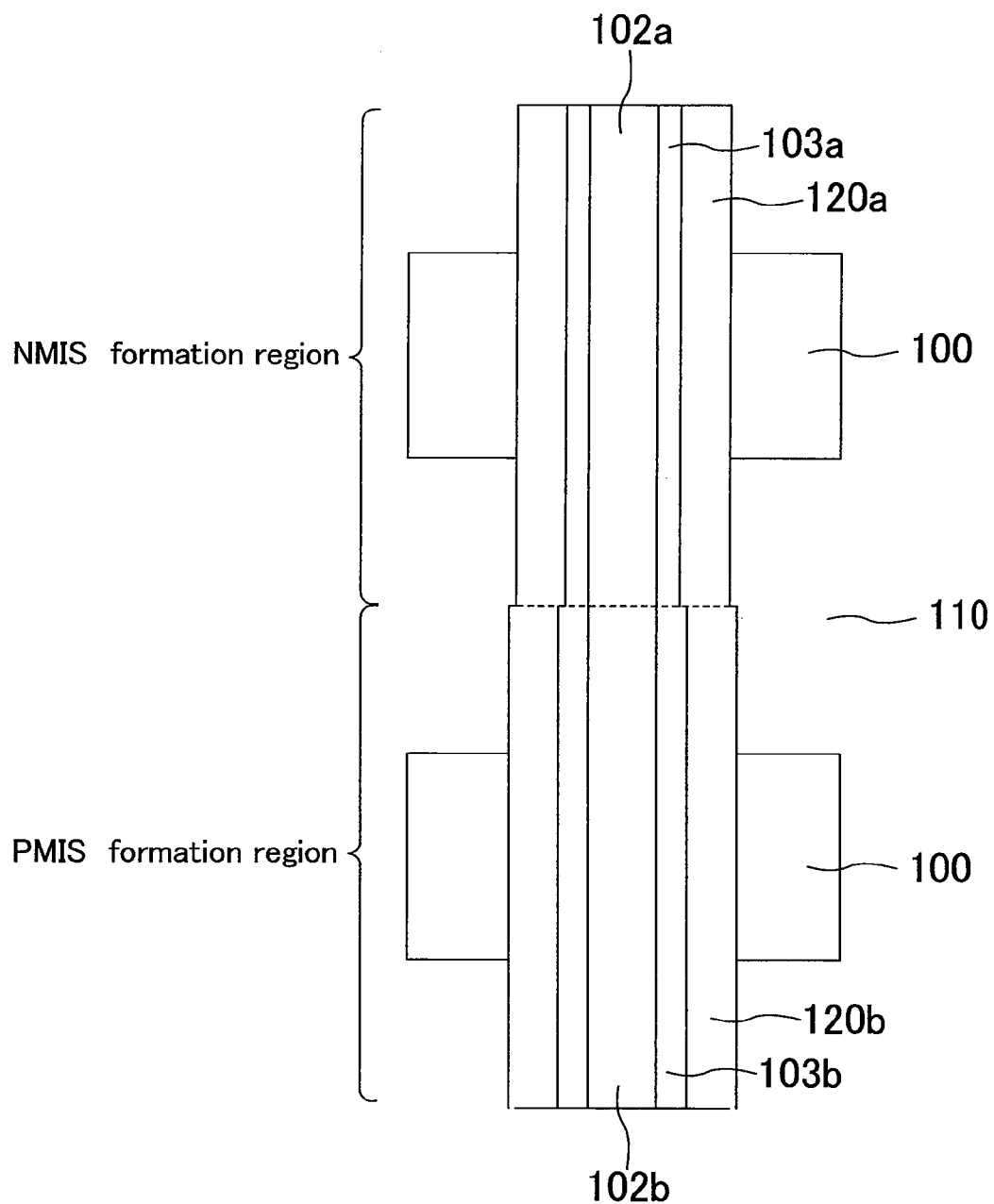
FIG. 2 is a plan view showing the semiconductor device of the first embodiment, in which an n-channel MISFET and a p-channel MISFET are formed continuously in the gate width direction.

FIG. 2 is a plan view showing the semiconductor device according to the first embodiment of the present invention, in which an n-channel MISFET and a p-channel MISFET are formed continuously in the gate width direction. In this figure, the n-channel MISFET is shown on the upper side, and the p-channel MISFET on the lower side. Like reference numerals to those of FIG. 1 are used in the figure.

As shown in FIG. 2, the first inner side wall 103a and the second inner side wall 103b are formed continuously, and the thickness of the first inner side wall 103a and that of the second inner side wall 103b are varied from each other at a boundary portion 110 between the n-channel MISFET and the p-channel MISFET.

In the above configuration, a feature of the semiconductor device of the present embodiment is that the film density of the first inner side wall 103a of the n-channel MISFET is greater than the film density of the second inner side wall 103b, and that the width of the first inner side wall 103a is smaller than the width of the second inner side wall 103b (in other words, the width of the second inner side wall 103b is larger than the width of the first inner side wall 103a). As will be described later, while the first inner side wall 103a and the second inner side wall 103b are formed by an insulating film deposited in a single step, the first inner side wall 103a is formed by a portion of the insulating film that is shrunk by an ultraviolet irradiation, or the like.

In the semiconductor device of the present embodiment, when the insulating film of the first inner side wall 103a is irradiated with ultraviolet rays, hydrogen atoms in the insulating film are dissociated. Thus, the hydrogen concentration in the first inner side wall 103a of the n-channel MISFET is lower than the hydrogen concentration in the second inner side wall 103b. In other words, the hydrogen concentration in the second inner side wall 103b is higher than the hydrogen concentration in the first inner side wall 103a.

With the configuration of the present embodiment, the width of the first inner side wall 103a can be made smaller than the width of the second inner side wall 103b, thereby making it possible to produce the n-channel MISFET while taking into consideration the fact that the thermal diffusion of arsenic contained in the first extension region 132a during the activation annealing is smaller than that of boron, which is used as the p-type impurity. Therefore, the amount of overlap between the first gate electrode 102a and the first extension region 132a can be optimized, as well as the amount of overlap between the second gate electrode 102b and the second extension region 132b. Thus, it is possible to prevent the deterioration of the ON current by preventing the amount of gate overlap from becoming too small in the n-channel MISFET, while reducing the short-channel characteristic degradation of the p-channel MISFET.

Note that while SiON is used as the material of the gate insulating film of the MISFET in the semiconductor device of the present embodiment, the material may be a silicon oxide or any other suitable insulator material.

While the first outer side wall 120a and the second outer side wall 120b are formed by a single-layer insulating film, it may be formed by a multi-layer insulating film. For example, an outer side wall may be formed on the side surface of the first inner side wall 103a and the second inner side wall 103b, in which the outer side wall includes a silicon oxide film having an L-shaped cross section in the gate length direction, and a silicon nitride film formed on the silicon oxide film.

While a silicon nitride is used as a material of the inner side wall in the semiconductor device of the present embodiment, the material is not limited to this as long as it is an insulator that can be location-selectively shrunk by ultraviolet irradiation, or the like, after being deposited. Note, however, that it is most preferred to use a silicon nitride for its large post-formation shrinkage.

An upper portion or the entirety of the first gate electrode 102a and the second gate electrode 102b may be silicided with Ni, etc. An upper portion of the first source/drain region 130a and the second source/drain region 130b may be silicided with Ni, etc.

—Method for Manufacturing Semiconductor Device—

FIGS. 3A to 3D and 4A to 4C are cross-sectional views showing a method for manufacturing the semiconductor device of the first embodiment.

Figure 3:
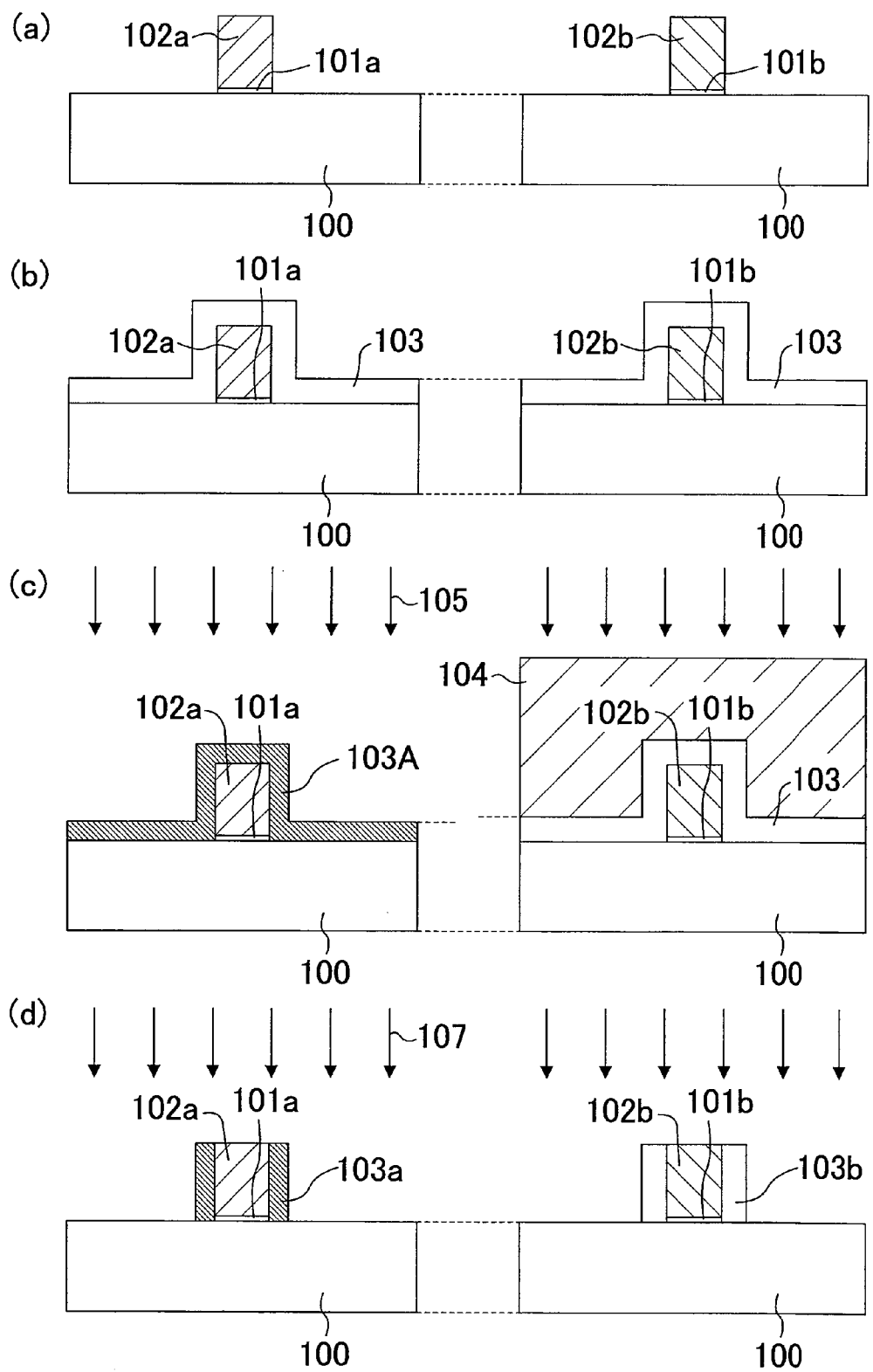
FIGS. 3A to 3D are cross-sectional views showing a method for manufacturing the semiconductor device of the first embodiment.

First, as shown in FIG. 3A, the first gate insulating film 101a made of SiON, or the like, and the first gate electrode 102a made of a conductor such as polysilicon are successively formed by a known method on the NMIS formation region (left-hand portion of the figure) of the semiconductor substrate 100 made of silicon, or the like. At the same time, the second gate insulating film 101b made of SiON, or the like, and the second gate electrode 102b made of a conductor such as polysilicon are successively formed on the PMIS formation region (right-hand portion of the figure) of the semiconductor substrate 100. Here, the thickness of the first gate insulating film 101a and that of the second gate insulating film 101b are both 2 nm, and the thickness of the first gate electrode 102a and that of the second gate electrode 102b are both 120 nm. The gate length of the first gate electrode 102a and the second gate electrode 102b is 50 nm, for example.

Then, as shown in FIG. 3B, a hydrogen-containing silicon nitride film 103 having a thickness of 10 nm, for example, is formed across the entire upper surface of the substrate (the semiconductor device being manufactured) by a plasma CVD (Chemical Vapor Deposition) method. Here, the plasma CVD is performed, using an ammonium ($NH_3$) gas and a silane ($SiH_4$) gas as material gases, and setting the deposition temperature to 300 to 400° C. Where the plasma CVD method is used, the resulting silicon nitride film contains a relatively high concentration of hydrogen from the material gas.

Then, as shown in FIG. 3C, after a resist mask 104 of an ultraviolet-blocking material such as a novolac resin is formed on the PMIS formation region (right-hand portion of the figure) of the semiconductor substrate 100, an ultraviolet irradiation 105 is performed across the entire wafer surface. The ultraviolet irradiation 105 of the present embodiment uses ultraviolet rays whose wavelength is 200 nm, and the irradiation is done for 15 minutes. The power of the ultraviolet irradiation is set to 100 mW/cm$^2$. Then, hydrogen is eliminated from the hydrogen-containing silicon nitride film 103 in the NMIS formation region (left-hand portion of the figure) where the resist mask 104 is absent, and the hydrogen-containing silicon nitride film 103 is turned into a silicon nitride film 103A having a thickness of 8 nm. On the other hand the hydrogen-containing silicon nitride film 103 in the PMIS formation region is blocked from ultraviolet rays by the resist mask 104, and therefore the thickness thereof remains unchanged.

Then, as shown in FIG. 3D, after the resist mask 104 is removed, an etch back 107 is performed on the silicon nitride film 103A and the hydrogen-containing silicon nitride film 103 using a dry etching method, thus forming the first inner side wall 103a made of the silicon nitride film 103A on the side surface of the first gate electrode 102a and the second inner side wall 103b made of the hydrogen-containing silicon nitride film 103 on the side surface of the second gate electrode 102b. The thickness of the first inner side wall 103a is 8 nm, and the thickness of the second inner side wall 103b is 10 nm. The concentration of hydrogen contained in the first inner side wall 103a is lower than the concentration of hydrogen contained in the second inner side wall 103b, and the film density of the first inner side wall 103a is greater than the film density of the second inner side wall 103b. The composition ratio between silicon and nitrogen in the first inner side wall 103a is equal to that in the second inner side wall 103b because it is not influenced by the ultraviolet irradiation. Note that depending on the conditions, the etching rate is not substantially varied between the hydrogen-containing silicon nitride film 103, which is not irradiated with ultraviolet rays, and the silicon nitride film 103A, which is irradiated with ultraviolet rays.

Figure 4:
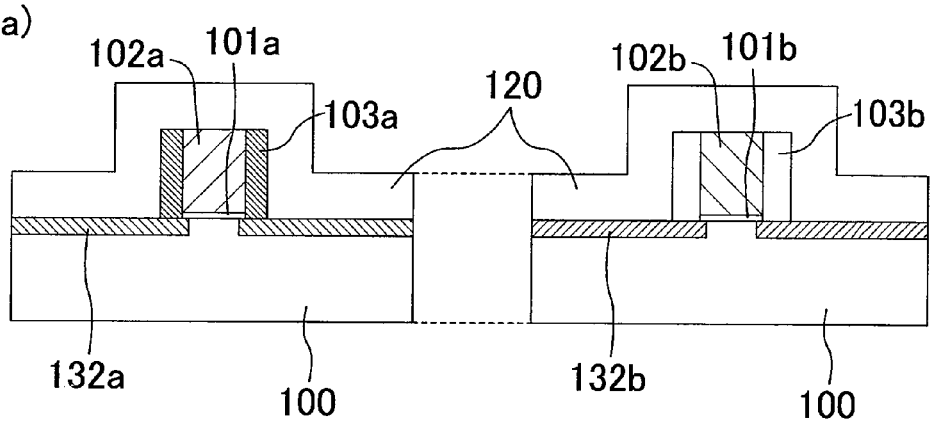
FIGS. 4A to 4C are cross-sectional views showing a method for manufacturing the semiconductor device of the first embodiment.
Figure 4:
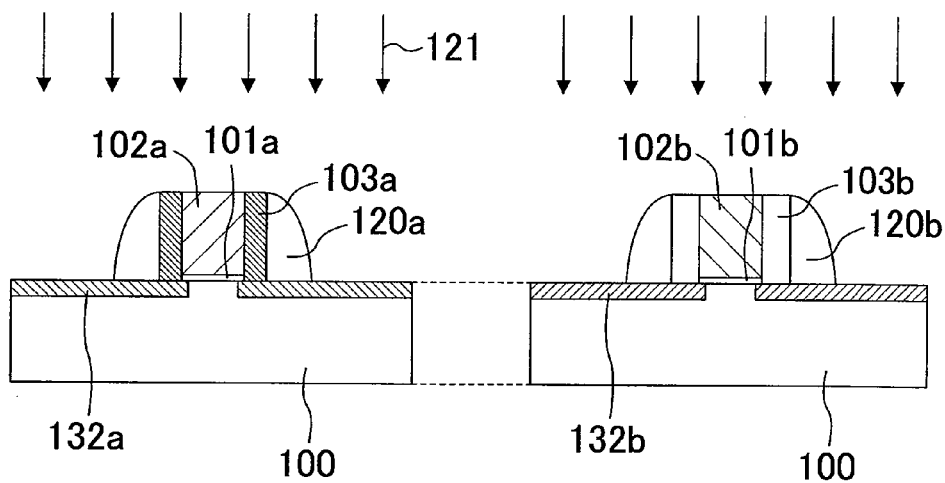
Figure 4:
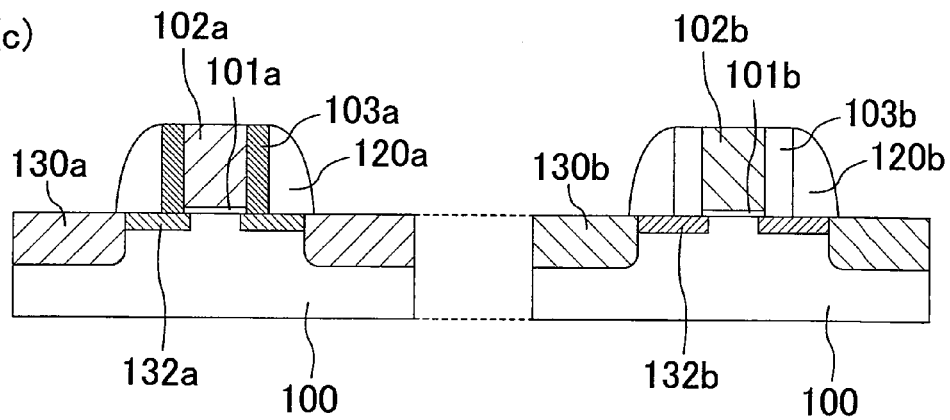

Then, as shown in FIG. 4A, arsenic is ion-implanted selectively into the NMIS formation region of the semiconductor substrate 100 using the first gate electrode 102a and the first inner side wall 103a as a mask in the presence of a resist (not shown) covering the PMIS formation region, thereby forming the first extension region 132a. In this process, the implantation energy is set to 2 keV, and the dose to $1 \times 10^{15}$ atoms/cm$^2$, for example. Then, after the resist covering the PMIS formation region is removed, boron is ion-implanted selectively into the PMIS formation region of the semiconductor substrate 100 using the second gate electrode 102b and the second inner side wall 103b as a mask in the presence of a resist (not shown) covering the NMIS formation region, thereby forming the second extension region 132b. In this process, the implantation energy is set to 0.4 keV and the dose to $5 \times 10^{14}$ atoms/cm$^2$, for example. Then, after the resist covering the NMIS formation region is removed, a silicon oxide film 120, such as a TEOS (Tetraethyl Orthosilicate) film, having a thickness of 40 nm is formed across the entire upper surface of the substrate (the semiconductor device being manufactured) by a thermal CVD method.

Then, as shown in FIG. 4B, an etch back 121 is performed on the silicon oxide film 120 using a dry etching method, thus forming an outer side wall made of the silicon oxide film 120 on the side surface of each gate electrode. That is, the first outer side wall 120a having a width (thickness) of 40 nm is formed on the side surface of the first gate electrode 102a in the NMIS formation region (left-hand portion of the figure), with the first inner side wall 103a interposed therebetween. The second outer side wall 120b having a width of 40 nm is formed on the side surface of the second gate electrode 102b in the PMIS formation region (right-hand portion of the figure), with the second inner side wall 103b interposed therebetween.

Then, as shown in FIG. 4C, arsenic is ion-implanted selectively into the NMIS formation region of the semiconductor substrate 100 using the first gate electrode 102a, the first inner side wall 103a and the first outer side wall 120a as a mask in the presence of a resist (not shown) covering the PMIS formation region, thereby forming the first source/drain region 130a. In this process, the implantation energy is set to 20 keV, and the dose to $5 \times 10^{15}$ atoms/cm$^2$, for example. Then, after the resist covering the PMIS formation region is removed, boron is ion-implanted selectively into the PMIS formation region of the semiconductor substrate 100 using the second gate electrode 102b, the second inner side wall 103b and the second outer side wall 120b as a mask in the presence of a resist (not shown) covering the NMIS formation region, thereby forming the second source/drain region 130b. In this process, the implantation energy is set to 2 keV, and the dose to $5 \times 10^{15}$ atoms/cm$^2$, for example. Then, after the resist covering the NMIS formation region is removed, an activation annealing (1050° C., 0 sec, in a nitrogen gas atmosphere) is performed to thereby activate impurities in the extension regions and the source/drain regions. Note that the amount of hydrogen eliminated from the second inner side wall 103b by the activation annealing is very small as compared with the amount of hydrogen eliminated by the ultraviolet irradiation. As a result, the second inner side wall 103b contains a higher concentration of hydrogen than the first inner side wall 103a, and the width of the first inner side wall 103a remains to be smaller than the width of the second inner side wall 103b.

As described above, with the method of the present embodiment, after the hydrogen-containing silicon nitride film 103 for offset side walls is deposited, an ultraviolet irradiation is performed while selecting a region to be irradiated using a resist mask, thus forming the first inner side wall 103a having a smaller width than the second inner side wall 103b. Therefore, even when arsenic, which has a small impurity diffusion during activation annealing, is used as the impurity for forming the first extension region 132a, the area over which the first extension region 132a overlaps with the first gate electrode 102a (the amount of overlap in the n-channel MISFET) can be made substantially equal (2 nm) to the area over which the second extension region 132b overlaps with the second gate electrode 102b (the amount of overlap in the p-channel MISFET).

With the method of the present embodiment, an ultraviolet irradiation is performed, in the step shown in FIG. 3C, as a method for selectively eliminating hydrogen from the hydrogen-containing silicon nitride film 103. Therefore, it is possible to efficiently eliminate only hydrogen from a portion of the hydrogen-containing silicon nitride film 103 that is provided in the NMIS formation region without eliminating hydrogen from another portion thereof that is provided in the PMIS formation region.

With the method of the present embodiment, the width of the first inner side wall 103a can be precisely controlled within a predetermined range by adjusting the ultraviolet irradiation conditions (the wavelength, the power, the irradiation time, etc.). Therefore, it is possible to optimize the impurity profile of MISFETs for each conductivity type, and to thereby manufacture a semiconductor device having MISFETs of stable characteristics. Note that the ultraviolet irradiation conditions described above are merely illustrative, and the width of the first inner side wall 103a can be made even smaller by, for example, improving the power of the ultraviolet irradiation or by elongating the irradiation time.

While a novolac resin is mentioned as the material of the resist mask 104, it is not limited to this as long as it is a film capable of blocking ultraviolet rays.

An upper portion or the entirety of the first gate electrode 102a and the second gate electrode 102b may be silicided with Ni or Pt after the step shown in FIG. 4C, or a so-called metal gate electrode may be formed by filling up grooves formed by the first inner side wall 103a and the second inner side wall 103b with a metal after removing polysilicon. An upper portion of the first source/drain region 130a and the second source/drain region 130b may be silicided with Ni, or the like.

The region in which the offset side wall (inner side wall) is thinned does not have to be the NMIS formation region, but the method of the present embodiment is applicable to any suitable case where MISFETs are provided on the same substrate with different amounts of overlap between the gate electrode and the extension region.

Note that although a hydrogen-containing insulating film can be formed also when an insulating film (e.g., a silicon oxide film) other than a silicon nitride film is formed by using a plasma CVD method in the step shown in FIG. 3B, it is most preferred to use a silicon nitride film in that the thickness can be varied substantially through the elimination of hydrogen.

Second Embodiment

Figure 5:
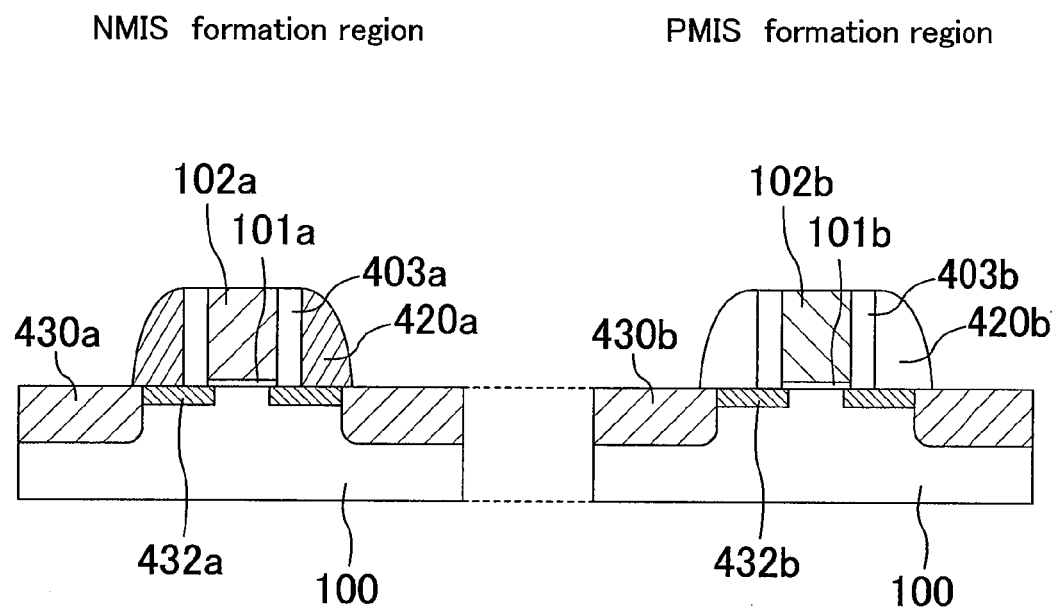
FIG. 5 is a cross-sectional view showing a semiconductor device according to a second embodiment of the present invention.

FIG. 5 is a cross-sectional view showing a semiconductor device according to a second embodiment of the present invention. In the figure, like elements to those of the semiconductor device of the first embodiment shown in FIG. 1 are denoted by like reference numerals. FIG. 5 shows an n-channel MISFET in a left-hand portion and a p-channel MISFET in a right-hand portion.

In the semiconductor device of the present embodiment, the MISFET characteristics are improved by thinning the outer side wall of the n-channel MISFET as compared with the outer side wall of the p-channel MISFET and optimizing the impurity concentration profile of the source/drain region.

As shown in FIG. 5, the semiconductor device of the present embodiment includes an n-channel MISFET formed in the NMIS formation region of the semiconductor substrate 100, and a p-channel MISFET formed in the PMIS formation region of the semiconductor substrate 100. Note that a p-type region (not shown) such as a p-type well is formed in the NMIS formation region of the semiconductor substrate 100, and an n-type region (not shown) such as an n-type well is formed in the PMIS formation region of the semiconductor substrate 100.

The n-channel MISFET includes the first gate insulating film 101a formed on the NMIS formation region of the semiconductor substrate 100, the first gate electrode 102a made of a conductor such as polysilicon and formed on the first gate insulating film 101a, a first inner side wall 403a made of a silicon oxide film and formed on the side surface of the first gate electrode 102a, a first outer side wall 420a made of a silicon nitride formed on the side surface of the first inner side wall 403a, a first extension region 432a containing an n-type impurity and formed in regions of the semiconductor substrate 100 that are located on opposite sides of the first gate electrode 102a under the first inner side wall 403a and the first outer side wall 420a, and a first source/drain region 430a containing a higher concentration of an n-type impurity than the first extension region 432a and formed in contact with the first extension region 432a in regions of the semiconductor substrate 100 that are located beside the first outer side wall 420a. The n-type impurity contained in the first extension region 432a and the first source/drain region 430a is arsenic or phosphorus, for example. The width of the first inner side wall 403a is 9 nm, and the width of the first outer side wall 420a is 36 nm.

The p-channel MISFET includes the second gate insulating film 101b formed on the PMIS formation region of the semiconductor substrate 100, the second gate electrode 102b made of polysilicon, or the like, and formed on the second gate insulating film 101b, a second inner side wall 403b made of a silicon oxide film formed on the side surface of the second gate electrode 102b, a second outer side wall 420b made of a silicon nitride formed on the side surface of the second inner side wall 403b, a second extension region 432b containing a p-type impurity and formed in regions of the semiconductor substrate 100 that are located on opposite sides of the second gate electrode 102b under the second inner side wall 403b and the second outer side wall 420b, and a second source/drain region 430b containing a higher concentration of a p-type impurity than the second extension region 432b and formed in contact with the second extension region 432b in regions of the semiconductor substrate 100 that are located beside the second outer side wall 420b. The width of the second inner side wall 403b is 9 nm, for example, and is equal to the width of the first inner side wall 403a. The width of the second outer side wall 420b is 40 nm, for example, and is at least larger than the width of the first outer side wall 420a. The p-type impurity contained in the second source/drain region 430b and the second extension region 432b is boron, for example. Although the composition ratio between silicon and nitrogen is equal between the first outer side wall 420a and the second outer side wall 420b, the first outer side wall 420a has a greater film density than the second outer side wall 420b. This is because the second outer side wall 420b contains more hydrogen than the first outer side wall 420a. The first gate insulating film 101a and the second gate insulating film 101b are formed by SiON, for example.

A feature of the semiconductor device of the present embodiment is that the film density of the first outer side wall 420a of the n-channel MISFET is greater than the film density of the second outer side wall 420b, and that the width of the first outer side wall 420a is smaller than the width of the second outer side wall 420b (in other words, the width of the second outer side wall 420b is larger than the width of the first outer side wall 420a). As will be described later, while the first outer side wall 420a and the second outer side wall 420b are formed by an insulating film deposited in a single step, the first outer side wall 420a is formed by a portion of the insulating film that is shrunk by an ultraviolet irradiation, or the like.

In the semiconductor device of the present embodiment, when the insulating film of the first outer side wall 420a is irradiated with ultraviolet rays, hydrogen atoms in the insulating film are dissociated. Thus, the hydrogen concentration in the first outer side wall 420a of the n-channel MISFET is lower than the hydrogen concentration in the second outer side wall 420b. In other words, the hydrogen concentration in the second outer side wall 420b is higher than the hydrogen concentration in the first outer side wall 420a.

With the configuration of the present embodiment, the width of the first outer side wall 420a can be made smaller than the width of the second outer side wall 420b, thereby making it possible to produce the n-channel MISFET while taking into consideration the fact that the thermal diffusion of arsenic contained in the first source/drain region 430a during the activation annealing is smaller than that of boron, which is used as the p-type impurity. Therefore, the position of the source/drain region and the impurity concentration profile can be optimized separately for each of the n-channel MISFET and the p-channel MISFET, thus making it possible to reduce the diffusion layer resistance of the n-channel MISFET, particularly the extension resistance under the side wall, without causing problems in the p-channel MISFET. Therefore, it is possible to prevent the degradation of the ON current of the n-channel MISFET. As described above, even when an n-type impurity having a small impurity thermal diffusion, such as arsenic, is used in the source/drain region, it is possible to prevent a region of a high diffusion layer resistance, particularly an extension region under the side wall, from being overly formed, and it is therefore possible to suppress the degradation of the ON current.

Note that while SiON is used as the material of the gate insulating film of the MISFET in the semiconductor device of the present embodiment, the material may be a silicon oxide or any other suitable insulator material.

While a silicon nitride is used as a material of the outer side wall in the semiconductor device of the present embodiment, the material is not limited to this as long as it is an insulator that can be location-selectively shrunk by ultraviolet irradiation, or the like, after being deposited. Note, however, that it is most preferred to use a silicon nitride for its large post-formation shrinkage.

While the width of the first inner side wall 403a is equal to that of the second inner side wall 403b in the semiconductor device of the present embodiment, the present invention is not limited to this, and the widths may be varied from each other as shown in the first embodiment.

An upper portion or the entirety of the first gate electrode 102a and the second gate electrode 102b may be silicided with Ni, etc. An upper portion of the first source/drain region 430a and the second source/drain region 430b may be silicided with Ni, etc.

—Method for Manufacturing Semiconductor Device—

FIGS. 6A to 6D and 7A to 7C are cross-sectional views showing a method for manufacturing the semiconductor device of the second embodiment.

Figure 6:
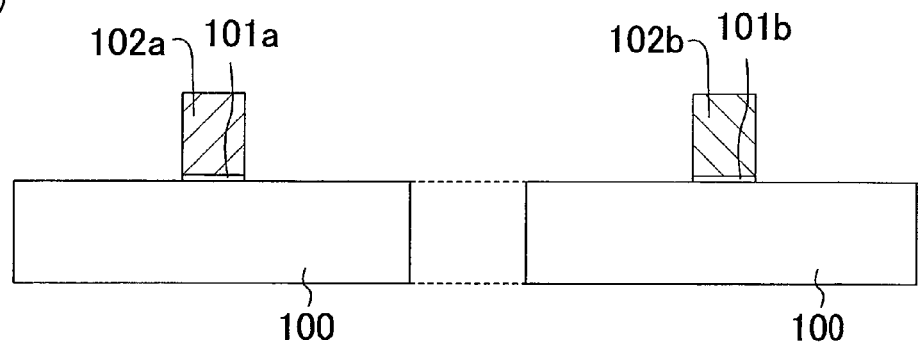
FIGS. 6A to 6D are cross-sectional views showing a method for manufacturing the semiconductor device of the second embodiment.
Figure 6:
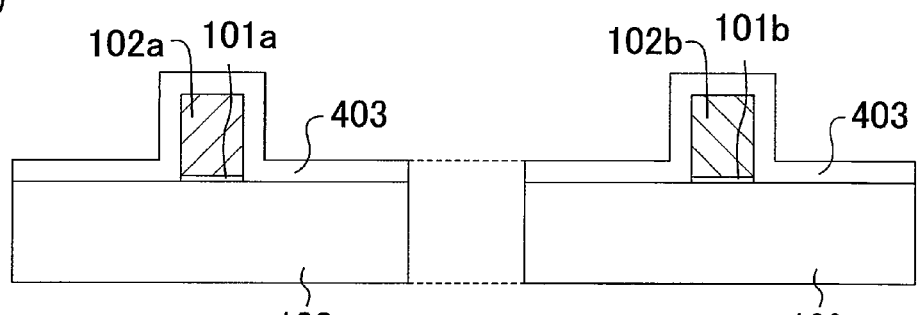
Figure 6:
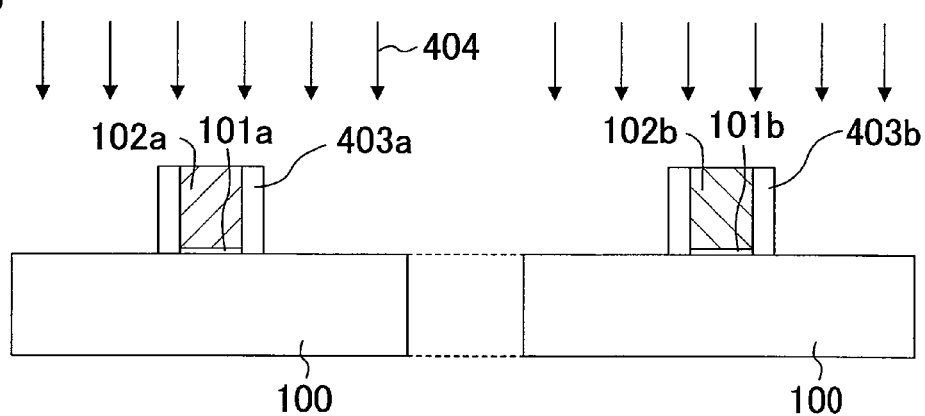
Figure 6:
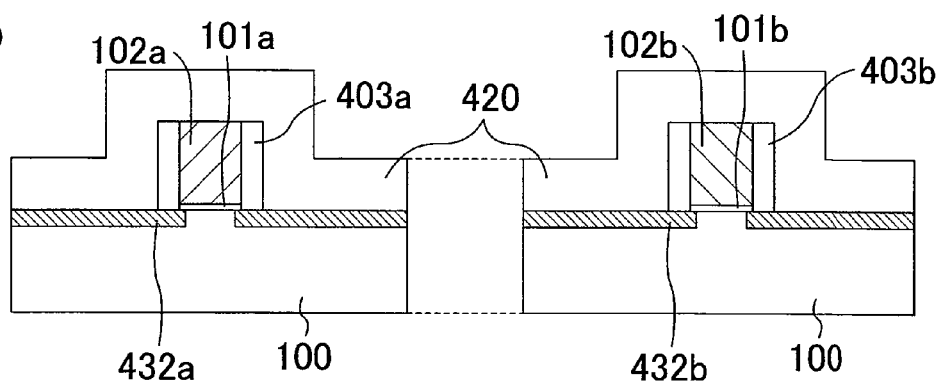

First, as shown in FIG. 6A, the first gate insulating film 101a made of SiON, or the like, and the first gate electrode 102a made of a conductor such as polysilicon are successively formed by a known method on the NMIS formation region (left-hand portion of the figure) of the semiconductor substrate 100 made of silicon, or the like. At the same time, the second gate insulating film 101b made of SiON, or the like, and the second gate electrode 102b made of a conductor such as polysilicon are successively formed on the PMIS formation region (right-hand portion of the figure) of the semiconductor substrate 100. Here, the thickness of the first gate insulating film 101a and that of the second gate insulating film 101b are both 2 nm, and the thickness of the first gate electrode 102a and that of the second gate electrode 102b are both 120 nm. The gate length of the first gate electrode 102a and the second gate electrode 102b is 50 nm.

Then, as shown in FIG. 6B, a silicon oxide film 403 such as a TEOS having a thickness of about 9 nm is formed by a thermal CVD method across the entire upper surface of the substrate (the semiconductor device being manufactured).

Then, as shown in FIG. 6C, an etch back 404 is performed on the silicon oxide film 403 using a dry etching method, thus forming an offset side wall made of the silicon oxide film 403 on the side surface of each gate electrode. That is, the first inner side wall 403a having a thickness of 9 nm is formed on the side surface of the first gate electrode 102a of the NMIS formation region (left-hand portion of the figure). The second inner side wall 403b having a thickness of 9 nm is formed on the side surface of the second gate electrode 102b of the PMIS formation region (right-hand portion of the figure).

Then, as shown in FIG. 6D, arsenic is ion-implanted selectively into the NMIS formation region using the first gate electrode 102a and the first inner side wall 403a as a mask in the presence of a resist (not shown) covering the PMTS formation region of the semiconductor substrate 100, thereby forming the first extension region 432a. In this process, the implantation energy is set to 2 keV, and the dose to $1.2 \times 10^{15}$ atoms/cm$^2$, for example. Then, after the resist covering the PMIS formation region is removed, boron is ion-implanted selectively into the PMIS formation region using the second gate electrode 102b and second outer side wall 403b as a mask in the presence of a resist (not shown) covering the NMIS formation region of the semiconductor substrate 100, thereby forming the second extension region 432b. In this process, the implantation energy is set to 0.4 keV, and the dose to $4 \times 10^{14}$ atoms/cm$^2$, for example. Then, after the resist covering the NMIS formation region is removed, a hydrogen-containing silicon nitride film 420 having a thickness of 40 nm is formed by a plasma CVD method across the entire upper surface of the substrate (the semiconductor device being manufactured). The deposition temperature of the hydrogen-containing silicon nitride film 420 is set to be about 300 to 400° C., and an ammonium gas, a silane gas, or the like, is used as the material gas.

Figure 7:
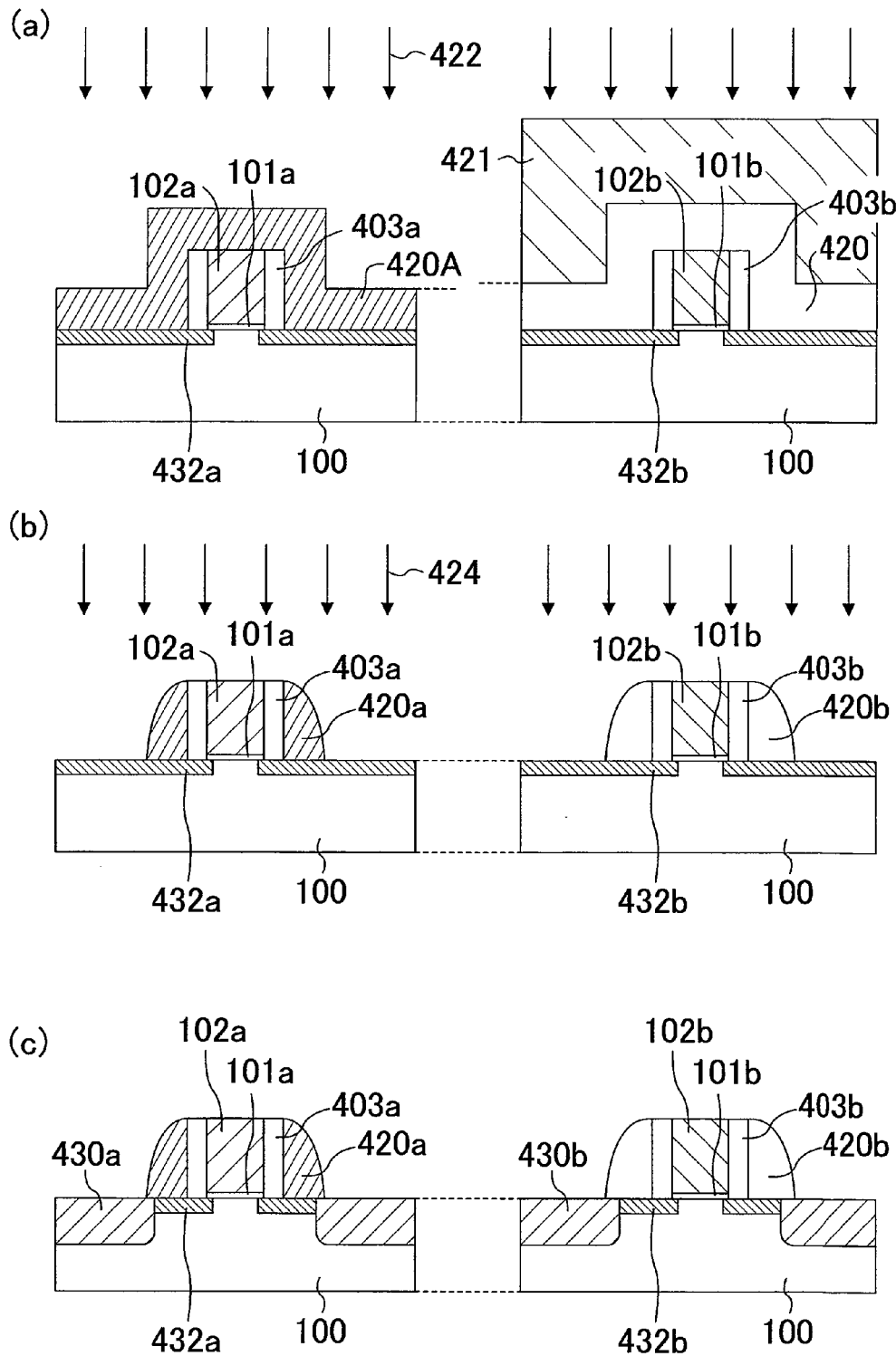
FIGS. 7A to 7C are cross-sectional views showing a method for manufacturing the semiconductor device of the second embodiment.
Figure 8:
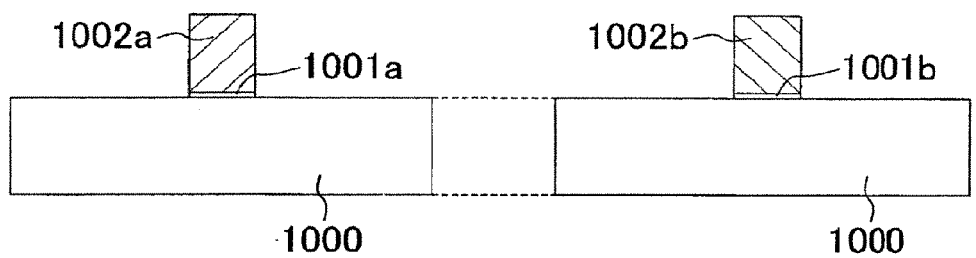
FIGS. 8A to 8D are diagrams showing a method for forming dual offset side walls according to a conventional example.
Figure 8:
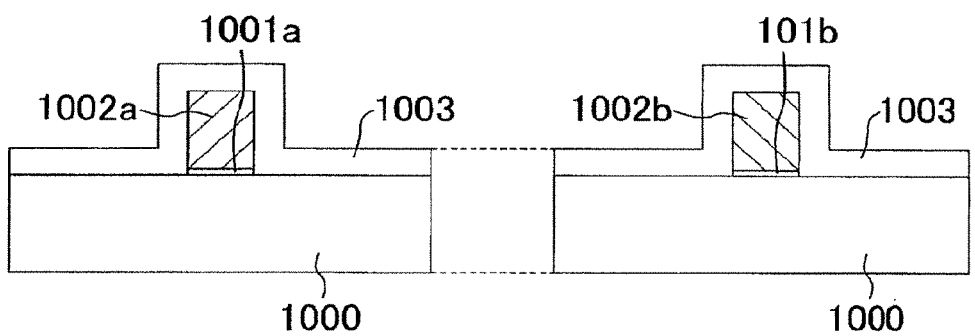
Figure 8:
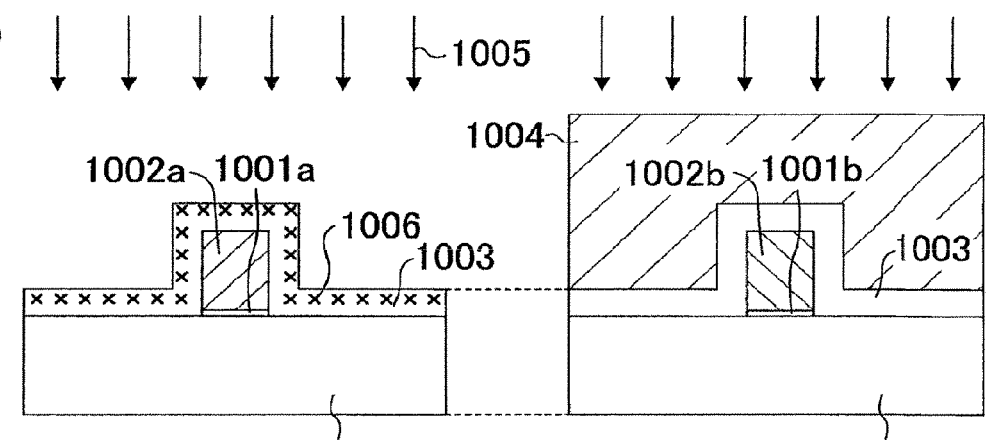
Figure 8:
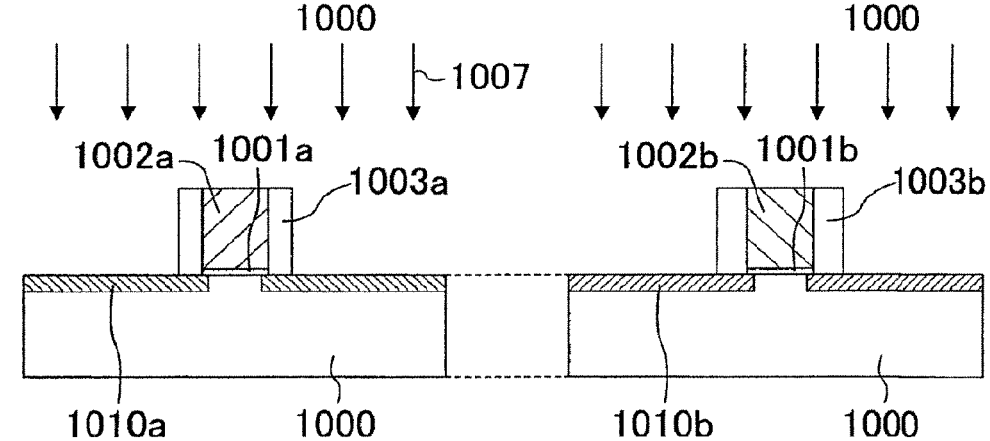

Then, as shown in FIG. 7A, a resist mask 421 of a novolac resin is formed on the PMIS formation region (right-hand portion of the figure) of the semiconductor substrate 100, and then an ultraviolet irradiation 422 is performed across the entire wafer surface. The ultraviolet irradiation is performed for about 15 minutes while setting the wavelength of ultraviolet rays to 200 nm. The power of the ultraviolet irradiation is set to 100 mW/cm$^2$. Then, a portion of the hydrogen-containing silicon nitride film 420 that is formed in the NMIS formation region (left-hand portion of the figure) where the resist mask 421 is absent is shrunk, and the portion is turned into a silicon nitride film 420A having a thickness of 36 nm. On the other hand, a portion of the hydrogen-containing silicon nitride film 420 that is formed in the PMIS formation region (right-hand portion of the figure) is blocked by the resist mask 421 from ultraviolet rays, and the thickness of this portion remains to be 40 nm.

Then, as shown in FIG. 7B, after the racist mask 421 is removed, an etch back 424 is performed on the silicon nitride film 420A and the hydrogen-containing silicon nitride film 420 using a dry etching method, thus forming a side wall on the side surface of each gate electrode. Therefore, in the NMIS formation region (left-hand portion of the figure), the first outer side wall 420a having a thickness of 36 nm and made of the silicon nitride film 420A is formed on the side surface of the first inner side wall 403a. On the other hand, in the PMIS formation region (right-hand portion of the figure), the second outer side wall 420b having a thickness of 40 nm and made of the hydrogen-containing silicon nitride film 420 is formed on the side surface of the second inner side wall 403b.

Then, as shown in FIG. 7C, arsenic is ion-implanted selectively into the NMIS formation region of the semiconductor substrate 100 using the first gate electrode 102a, the first inner side wall 403a and the first outer side wall 420a as a mask in the presence of a resist (not shown) covering the PMIS formation region, thereby forming the first source/drain region 430a. In this process, the implantation energy is set to 20 keV, and the dose to $4 \times 10^{15}$ atoms/cm$^2$. Then, after the resist covering the PMIS formation region is removed, boron is ion-implanted selectively into the PMIS formation region of the semiconductor substrate 100 using the second gate electrode 102b, the second inner side wall 403b and the second outer side wall 420b as a mask in the presence of a resist (not shown) covering the NMIS formation region, thereby forming the second source/drain region 430b. In this process, the implantation energy is set to 2 keV, and the dose to $5 \times 10^{15}$ atoms/cm$^2$. Then, after the resist covering the NMIS formation region is removed, an activation annealing is performed under conditions of 1050° C. and 0 sec in a nitrogen gas atmosphere, thereby activating the impurities in the extension region and the source/drain region. Note that the amount of hydrogen eliminated from the second outer side wall 420b by the activation annealing is very small as compared with the amount of hydrogen eliminated by the ultraviolet irradiation. As a result, the second outer side wall 420b contains a higher concentration of hydrogen than the first outer side wall 420a, and the width of the first outer side wall 420a remains to be smaller than the width of the second outer side wall 420b.

As described above, with the method of the present embodiment, after the hydrogen-containing silicon nitride film 420 for forming side walls is deposited, an ultraviolet irradiation is performed while selecting a region to be irradiated using a resist mask, thus forming the first outer side wall 420a having a smaller width than the second outer side wall 420b. Therefore, even when arsenic, which has a small impurity diffusion during activation annealing, is used as the impurity for forming the first source/drain region 430a, the distance between the first source/drain region 430a and the first gate electrode 102a can be made substantially equal (e.g., 40 nm) to the distance from the second source/drain region 430b to the second gate electrode 102b. Thus, it is possible to suppress an increase in the diffusion layer resistance, particularly an increase in the resistance in the extension region, in the n-channel MISFET, thereby preventing the degradation of the ON current.

With the method of the present embodiment, the width of the first outer side wall 420a can be precisely controlled within a predetermined range by adjusting the ultraviolet irradiation conditions (the wavelength, the power, the irradiation time, etc.). Therefore, it is possible to optimize the impurity profile of MISFETs of each conductivity type, and to thereby manufacture a semiconductor device having MISFETs of desirable electrical characteristics.

Note that the ultraviolet irradiation conditions described above are merely illustrative, and the width of the first outer side wall 420a can be made even smaller by, for example, improving the power of the ultraviolet irradiation or by elongating the irradiation time.

While a novolac resin has been shown as an example material of the resist mask 104, it is not limited to this as long as it is a film capable of blocking ultraviolet rays.

Instead of the offset side wall formation step shown in FIGS. 6B and 6C, the method for forming offset side walls of the first embodiment shown in FIGS. 3B to 3D may be used so as to vary the width of the offset side wall of the n-channel MISFET from that of the p-channel MISFET.

An upper portion or the entirety of the first gate electrode 102a and the second gate electrode 102b may be silicided with Ni or Pt after the step shown in FIG. 7C, or a so-called metal gate electrode may be formed by filling up grooves formed by the first inner side wall 403a and the second inner side wall 403b with a metal after removing polysilicon. An upper portion of the first source/drain region 430a and the second source/drain region 430b may be silicided with Ni, or the like.

The region in which the side wall is thinned does not have to be the NMIS formation region, but a side wall can be selectively thinned by irradiating an intended region with ultraviolet rays.

As described above, a semiconductor device of the present invention and a method for manufacturing the same are applicable to various types of semiconductor devices in which two or more kinds of MISFETs, e.g., n-channel MISFETs and p-channel MISFETs, are provided on the same substrate.

What is claimed is:

1. A semiconductor device comprising:
a semiconductor substrate in which a first region and a second region are formed;
a first MISFET including a first gate insulating film formed on the first region of the semiconductor substrate, a first gate electrode formed on the first gate insulating film, and a first side wall made of an insulator formed on a side surface of the first gate electrode; and
a second MISFET including a second gate insulating film formed on the second region of the semiconductor substrate, a second gate electrode formed on the second gate insulating film, and a second side wall made of an insulator formed on a side surface of the second gate electrode, wherein
a bottom width of the first side wall is smaller than a bottom width of the second side wall,
the first side wall includes a first spacer containing hydrogen,
the second side wall includes a second spacer containing a higher concentration of hydrogen than the first spacer,
the first side wall includes a first inner side wall having a rectangular shape formed on a side surface of the first gate electrode, and a first outer side wall formed on a side surface of the first inner side wall,
the second side wall includes a second inner side wall having a rectangular shape formed on a side surface of the second gate electrode, and a second outer side wall formed on a side surface of the second inner side wall,
the first inner side wall is the first spacer,
the second inner side wall is the second spacer, and
a bottom width of the first outer side wall is substantially the same as a bottom width of the second outer side wall.

2. The semiconductor device of claim 1, wherein a bottom width of the first spacer is smaller than a bottom width of the second spacer.

3. The semiconductor device of claim 1, wherein the first spacer and the second spacer are both made of a silicon nitride.

4. The semiconductor device of claim 1, wherein a film density of the first spacer is greater than a film density of the second spacer.

5. The semiconductor device of claim 1, wherein
the first MISFET further includes a first impurity diffusion layer of a first conductivity type formed in regions of the first region of the semiconductor substrate that are located on opposite sides of the first gate electrode and under the first spacer, and a first high-concentration impurity diffusion layer containing a higher concentration of a first-conductivity-type impurity than the first impurity diffusion layer and formed in regions of the first region of the semiconductor substrate that are located beside the first side wall, and
the second MISFET further includes a second impurity diffusion layer of a second conductivity type formed in regions of the second region of the semiconductor substrate that are located on opposite sides of the second gate electrode and under the second spacer, and a second high-concentration impurity diffusion layer containing a higher concentration of a second-conductivity-type impurity than the second impurity diffusion layer and formed in regions of the second region of the semiconductor substrate that are located beside the second side wall.

6. The semiconductor device of claim 5, wherein
the first impurity diffusion layer and the first high-concentration impurity diffusion layer contain arsenic, and
the second impurity diffusion layer and the second high-concentration impurity diffusion layer contain boron.

7. The semiconductor device of claim 1, wherein
the first MISFET is of an n-channel type, and
the second MISFET is of a p-channel type.

8. The semiconductor device of claim 1, wherein
the first and second gate electrodes are formed continuously in a gate width direction, and
the first side wall and the second side wall are formed continuously in the gate width direction.

9. The semiconductor device of claim 8, wherein
the first region and the second region are apart from each other in a gate width direction, and
a transition between the bottom width of the first spacer to the bottom width of the second spacer is located within a region between the first and second regions.

10. The semiconductor device of claim 1, wherein
the first and the second gate electrodes are formed continuously in a gate width direction, and
the first inner side wall and the second inner side wall are formed continuously in a gate width direction.

11. The semiconductor device of claim 10, wherein
the first region and the second region are apart from each other in a gate width direction, and
a transition between the bottom width of the first inner side wall to the bottom width of the second inner side wall is located within a region between the first and second regions.

12. The semiconductor device of claim 1, wherein an etching rate of the first spacer is substantially the same as an etching rate of the second spacer.

* * * * *